United States Patent [19]

Beggs et al.

[11] Patent Number: 4,916,348
[45] Date of Patent: Apr. 10, 1990

[54] SURFACE ACOUSTIC WAVE SCATTERING GRATING

[75] Inventors: Bruce C. Beggs, Kanata; Grantley O. Este, Stittsville, both of Canada

[73] Assignee: Northern Telecom Limited, Montreal, Canada

[21] Appl. No.: 342,542

[22] Filed: Apr. 24, 1989

[30] Foreign Application Priority Data

Apr. 13, 1989 [CA] Canada .................................. 596,653

[51] Int. Cl.$^4$ ............................................. H01L 41/08
[52] U.S. Cl. ............................... 310/313 D; 310/313 B
[58] Field of Search ................................. 310/313 AL; 333/150–155, 193–196

[56] References Cited

U.S. PATENT DOCUMENTS

| | | | |
|---|---|---|---|
| 3,906,410 | 9/1975 | Williams | 310/313 R X |
| 4,139,791 | 2/1979 | Yamada et al. | 310/313 C |
| 4,188,596 | 2/1980 | Miura | 310/313 C X |
| 4,354,129 | 10/1982 | Ieki | 310/313 C |
| 4,516,094 | 5/1985 | Lee | 310/313 D X |
| 4,679,014 | 7/1987 | Bulst et al. | 310/313 D |

FOREIGN PATENT DOCUMENTS 0083420  5/1983  Japan .................................. 333/195

OTHER PUBLICATIONS

Surface Wave Filters: Design, Construction, and Use; Chapter 9-Reflection Grating Filters, edited by H. Matthews, John Wiley & Sons, 1977, pp. 381–442.

Optical Study of Ultrasonic Diffraction & Focusing in Anistropic Media, by M. G. Cohn, *Journal of Appl. Physics*, vol. 38, No. 10, Sep. 1967, pp. 3821–3828.

Surface Wave Velocities, by A. J. Slobodnik et al., Microwave Acoustics Handbook, vol. 1A, Air Force Research Labs., Oct. 1973, p. 123.

*Primary Examiner*—Mark O. Budd
*Attorney, Agent, or Firm*—Philip W. Jones

[57] ABSTRACT

A grating is positioned on a surface acoustic wave device on a first axis in-line with the delay line for substantially reducing the amount of energy reflected on that axis to the transmitter and receiver. The grating site on the first axis at a position between the delay line and one of the edges of the device. The grating is comprised of a parallel series of grating members each oriented so as to extend at a first angle relative to the first axis, the grating members being generally longitudinally bisected by that axis. An optimum value for the first angle is provided by a theoretical analysis, and experimental results are presented. On the experimental device, the grating is defined by a series of parallel grooves formed in the surface of the device; however, the grating may also be defined by a series of metallic strips mounted on the surface of the device.

7 Claims, 4 Drawing Sheets

SURFACE ACOUSTIC WAVE SCATTERING GRATING

The invention relates to a means for reducing the reflected energy of surface acoustic waves, and more particularly, to a surface grating for scattering reflected wave energy in a surface acoustic wave (SAW) filter.

SAW devices are used primarily in filter and resonator applications. A SAW filter consists of a piezoelectric solid such as quartz, as well as a transmitter means and receiver means (together henceforth called a transmission means) positioned on a surface of that solid. When activated by electric signals, the transmitter means creates acoustic waves which propagate simultaneously in opposite directions along a first axis extending through the transmitter means. The waves that travel in one direction (along a path called the 'delay line') intersect the receiver means, whereas the waves that travel in the opposite direction meet a first edge of the solid and may be reflected back toward the transmitter means. The presence of such reflected waves at the transmitter means is undesirable because of their interference with non-reflected waves moving toward the receiver means. A similar effect is created at the receiver means by waves reflected from a second edge of the solid. It is desirable to lessen the energy of such reflected waves.

Several schemes have been proposed for reducing the amount of energy reflected in SAW devices. One common scheme involves the deposition of an inelastic viscous energy absorber on the surface of the solid adjacent to the transmitter means and receiver means. Another scheme involves the production of a semicylindrical face on the edges of the solid, whereby waves meeting those edges are not reflected by the edges but rather travel around it to the other side of the solid where they are absorbed. However, it is difficult to create arcuate edges because of the small thickness of the solid. A still further scheme involves the deposition of a resistive material on the surface of the device. Wave energy passing beneath the resistive material electrically couples into the resistive material, where it is dissipated. This last method is useful for dissipating the energy in strong piezoelectrics such as lithium niobate, where the electric component of wave energy is large. It is less useful for a weak piezoelectric such as quartz, where a large interaction distance would be required for a practical absorber.

It has now been found that the amount of energy reflected back to the delay line from the direction of an edge of the solid can be substantially reduced by forming a first grating in the solid surface at a position between that edge and the transmission means. The use of the grating provides several advantages over prior art acoustic absorbing techniques. The lack of an organic absorber material reduces the chances of outgassing contamination on the SAW surface, and results in more stable device performance. The gratings can be fabricated using standard photolithographic techniques, unlike common application methods for other energy absorbing schemes. The present invention attempts to destroy reflected wave coherence by coupling reflected energy into bulk waves. Energy which is not coupled into bulk modes is reflected from the grating and edges of the solid such that it is not subsequently sensed at the transmission means.

The first grating is comprised of a series of first grating members extending parallel to each other and crossing a first axis that extends in-line with the delay line. Each of the first grating members is positioned on the solid so as to be approximately longitudinally bisected by the first axis. The longitudinal axis of each first grating member is oriented at an angle relative to the first axis such that a substantial amount of the energy in waves propagating along the first axis toward the first grating is prevented from being reflected back toward the transmission means.

The relationship between the velocity '$V_{in}$' of the incident surface acoustic waves along the first axis, the frequency 'f' of those waves, the spatial periodicity 'd' of the first grating, the solid's anisotropy parameter '$\gamma$', and the angle '$\theta$' between the first axis and a normal to the longitudinal axis of each first grating member is approximated by the equation:

$$\frac{V_{in}}{f \cdot d} \sim (\cos\theta) + \left(\frac{1}{1 - \gamma\theta^2}\right) \cdot \sqrt{1 - ((\sin^2\theta) \cdot (1 - \gamma\theta^2)^2)}$$

This equation assumes that each first grating member has a width of one-half of 'd', and has a separation distance from adjacent grating members of one-half of 'd'. The grating members may be a series of grooves in the solid, or may be a series of ridges of aluminum or other metal deposited onto the surface of the solid. The depth of the grating member may be approximately one-eighth of the wavelength of the surface acoustic waves along the first axis. The width of the first grating measured in a direction normal to the first axis may be approximately twice as large as the width of the transmitter means in that direction. The number of first grating members may be at least approximately 0, and may be approximately 100. The surface on which the transmitter means and receiver means are positioned may be generally rectangular, with the first axis being generally parallel to the longer dimension. The pizoelectric solid may be quartz.

The piezoelectric solid may also have a second grating positioned between the transmission means and the second edge. The second grating is comprised of a series of second grating members extending parallel to each other and crossing the first axis. Each of the second grating members is positioned on the solid so as to be approximately longitudinally bisected by the first axis. The longitudinal axis of each second grating member is oriented at an angle relative to the first axis such that a substantial amount of the energy in waves propagating along the first axis toward the second grating is prevented from being reflected back toward the transmission means. The angle between the longitudinal axis of each second grating member and the first axis may be equal to the angle between the longitudinal axis of each first grating member and the first axis.

The invention will now be more fully described by means of the accompanying drawings, in which.

Figure 1:
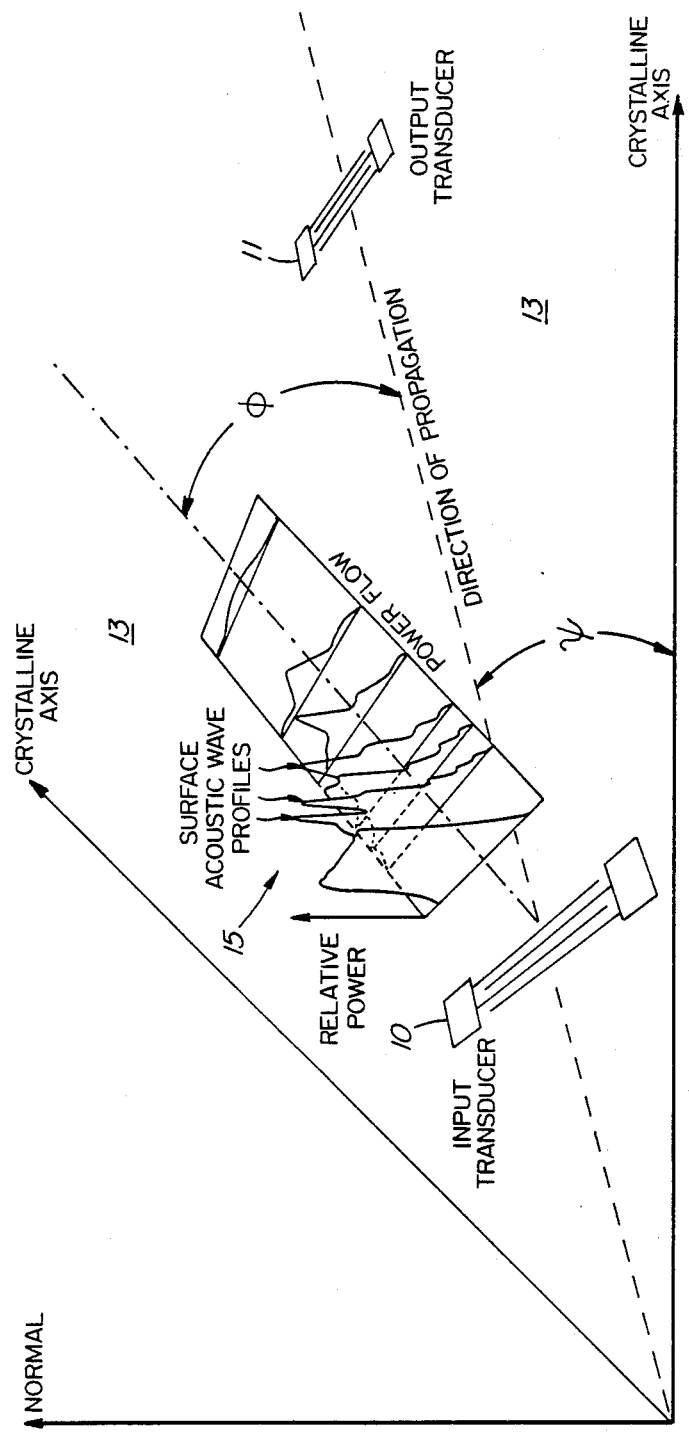
FIG. 1 is a schematic representation of the propagation of a surface acoustic wave on an anisotropic substrate.

With respect to FIG. 1, an input transducer 10 and an output transducer 11 are positioned on a crystalline solid generally designated 13 at an angle '$\psi$' with respect to a crystalline axis. A series of profiles generally designated 15 illustrate how the surface acoustic waves lose their uniform amplitude and phase as they travel away from the input transducer 10. The angle '$\phi$' is the power flow angle, which is measured relative to the axis connecting the input and output transducers. To avoid 'beam steering' in practical SAW devices, the angle '$\psi$' is always chosen so that the power flow angle '$\phi$' is zero. However, there usually exists some unintentional misalignment which results in some beam steering.

Figure 2:
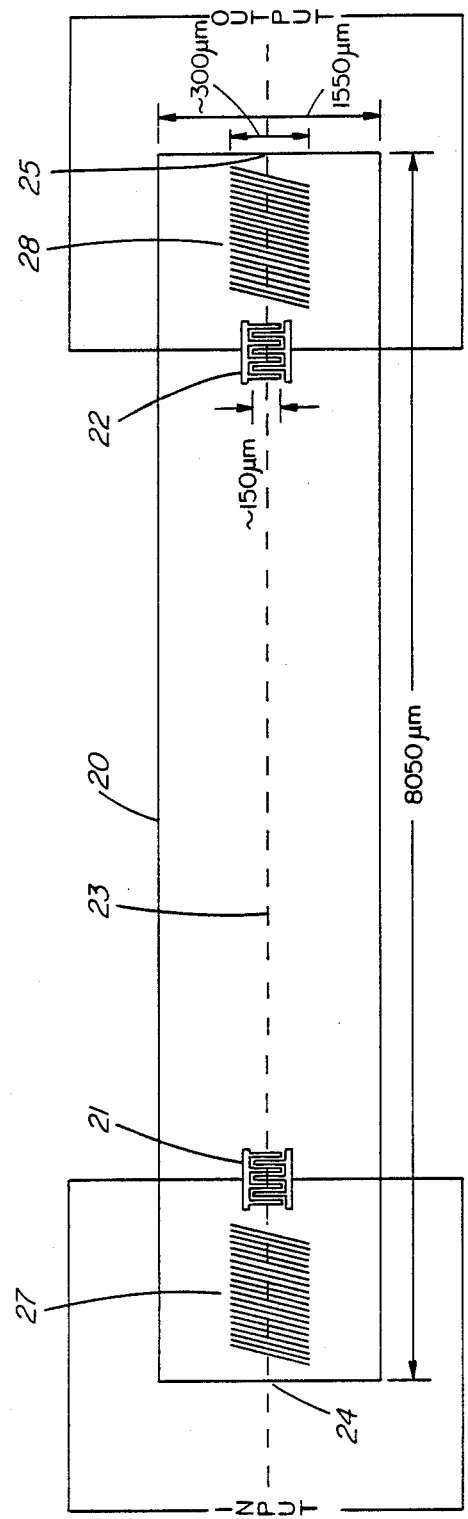
FIG. 2 is a schematic plan view of a piezoelectric solid having a transmitter means, a receiver means, and the first and second gratings of the invention.

FIG. 2 illustrates a generally rectangular piezoelectric solid 20 having an input transducer 21 and an output transducer 22. The surface acoustic waves travel along a first axis 23 between the two transducers. The first axis crosses a first edge 24 and a second edge 25 of solid 20. Between the first edge 24 and the input transducer 21 a grating 27 is positioned on the first axis 23. Grating 27 is defined by a series of first grooves which cross the first axis and are generally longitudinally bisected by that axis. A similar grating 28 is comprised of a series of second grooves which cross the first axis between the second edge 25 and the output transducer 22.

Figure 3:
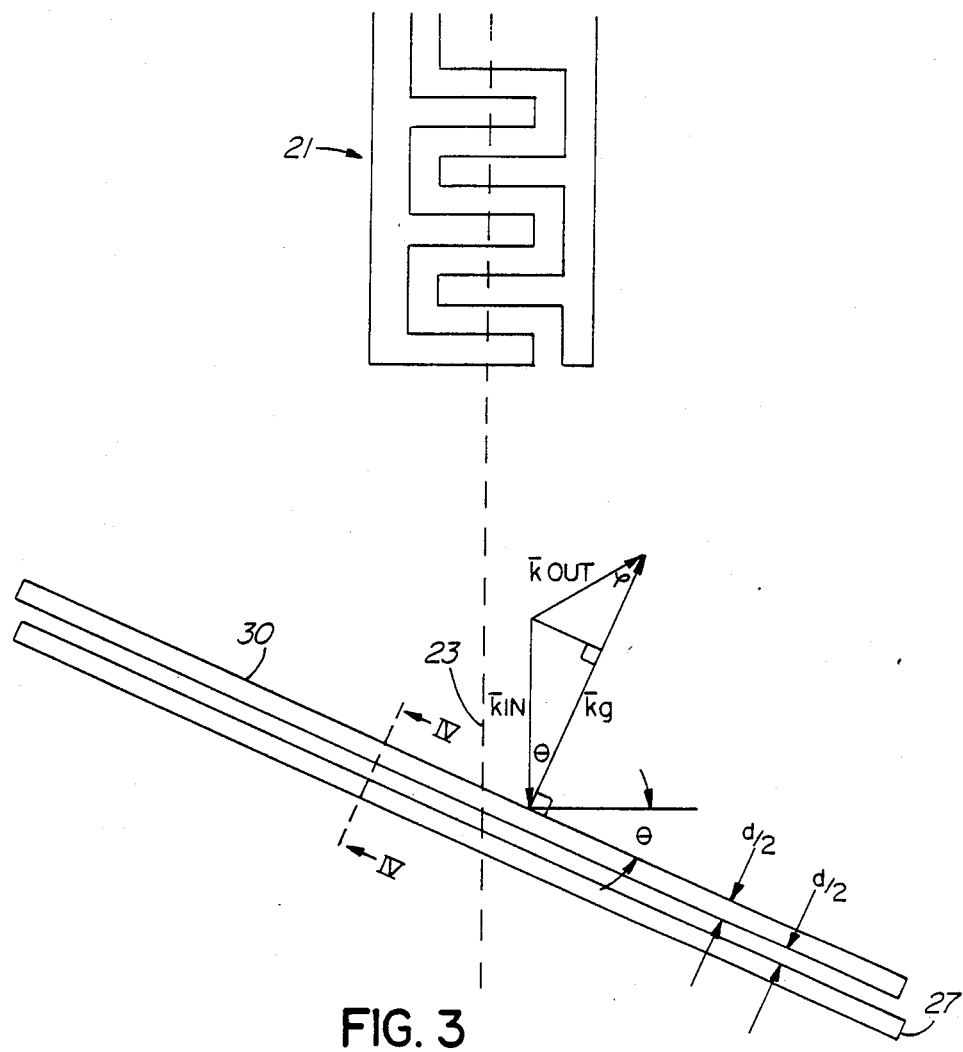
FIG. 3 illustrates the vectors involved in the scattering vector relationship between a surface acoustic wave moving along the first axis and a wave reflected from one of the grating members, and also illustrates the spacing between adjacent grating members.

The input transducer 21 and two most proximate grooves of the grating 27 are illustrated in FIG. 3. The grating has been found to be effective for wave scattering for a range of values of the angle '$\theta$', excepting values close to zero degrees and 90 degrees and also 45 degrees (at which angle, waves reflected from the grating approach the edge of the solid at a generally normal angle and are then reflected back to the grating and thence to the transmission means). The scattering has been found to be particularly effective at a value of '$\theta$' derived from the following analysis.

FIG. 3 is based on an analysis by R. C. Williamson in a chapter entitled 'Reflection Grating Filters' at pages 381 to 442 of the book 'Surface Wave Filters: Design, Construction, and Use', edited by H. Matthews (John Wiley & Sons, 1977). The spatial periodicity '$d$' of the grating is chosen based on satisfying a scattering vector relationship that describes oblique reflections in anisotropic substrates. The input, output and grating vectors are designated as $\overline{k}_{in}$, $\overline{k}_{out}$, and $\overline{k}_g$, where:

$$\overline{k}_{in} + \overline{k}_g = \overline{k}_{out}, \text{ with} |\overline{k}_{in}| = \frac{2 \cdot \pi \cdot f}{v_{in}} \text{ and} |\overline{k}_{out}| = \frac{2 \cdot \pi \cdot f}{v_{out}}$$

The input and output vectors are associated with the incident and reflected waves, respectively. The grating vector ($\overline{k}_g$) has a value $(2\pi \cdot n)/d$, where '$n$' is an integer (equal to 1 for fundamental reflection) and '$d$' is the spatial periodicity of the grating. The direction of the grating vector is perpendicular to the grating members. M. G. Cohen in 'Optical Study of Ultrasonic Diffraction and Focusing in Anisotropic Media', Journal of Applied Physics, (1967) Vol. 38, pp. 3821–3828, has shown that for some substrate materials the velocity as a function of propagation angle for small angles is approximately related by the equation:

$$\frac{V_{out}}{V_{in}} \sim 1 - (\gamma) \cdot (\theta)^2,$$

where '$\gamma$' is an anisotropy parameter that is characteristic of the piezoelectric solid 20, '$V_{in}$' is the wave velocity along the first axis, and '$V_{out}$' is the wave velocity measured in a direction offset by the angle '$\frac{1}{4}$' from the first axis. Experimental graphs of the variation of velocity with propagation angle can be found in A. J. Slobodnik, E. D. Conway, and R. T. Delmonico, 'Microwave Acoustics Handbook, Vol. 1A, Surface Wave Velocities', Air Force Cambridge Research Laboratories, October, 1973.

The value of the vectors $\overline{k}_{in}$, $\overline{k}_{out}$ and $\overline{k}_g$ can be used to determine a relationship between the frequency '$f$' of the input acoustic wave, the velocity '$V_{in}$' of that wave along the first axis, the spatial periodicity '$d$' of the grating, the solid's anisotropy parameter '$\gamma$', and the angle '$\theta$' formed between the first axis and the normal to the longitudinal axis of each grating member. From FIG. 3, it can be seen that the components of the three vectors can be equated in directions parallel and normal to the $\overline{k}_g$ vector:

$$(\overline{k}_{in}) \cdot \cos\theta + (\overline{k}_{out}) \cdot \cos\phi = (\overline{k}_g), \text{ and}$$

$$(\overline{k}_{in}) \cdot \sin\theta = (\overline{k}_{out}) \cdot \sin\phi.$$

Combining the three foregoing equations (with n=1), the relation is derived that:

$$\frac{V_{in}}{f \cdot d} \sim (\cos\theta) + \left(\frac{1}{1 - \gamma\theta^2}\right) \cdot \sqrt{1 - ((\sin^2\theta) \cdot (1 - \gamma\theta^2)^2)}$$

Figure 4:
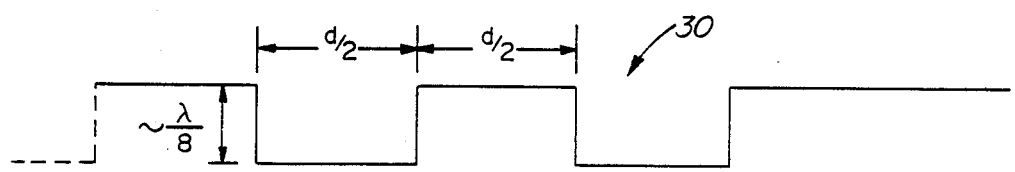
FIG. 4 is a partial cross-sectional view along the line IV—IV of the grating of FIG. 3, the grating being comprised of a series of grooves.

FIG. 4 illustrates a preferred cross-section for the grooves of FIG. 3. A groove depth approximating one-eighth of the wavelength of the incident wave was found to be effective. Normal to their longitudinal direction, the grooves had equal width and separation distance approximating one-half of '$d$', the spatial periodicity of the grating. To prevent surface acoustic waves avoiding grating 27, the width of that grating measured in a direction normal to the first axis 23 is made larger than the width of input transducer 21 in that direction. A width multiple of two has been found to be effective.

The grating 28 in FIG. 2 is intended to prevent reflection of the approximately 50% of the SAW energy from input transducer 21 which passes through output transducer 22. The effect of grating 28 on reflected SAW energy is similar to that already described with respect to grating 27.

A tested quartz SAW filter had a first grating 27 which extended from the input transducer 21 all the way to the first edge 24, and had a second grating 28 which extended from the output transducer 22 all the way to the second edge 25. The number of grooves in each grating was approximately 100, although it is believed that as few as approximately 10 grooves in each grating may be sufficient to substantially obtain the benefit of 15, the invention. The SAW device was rectangular in shape, having a length of 8050 μm. and a width of 1550 μm. The input transducer 21 and output transducer 22 were each 150 μm. wide, and each groove had a length of 300 μm. In the tests, the frequency 'f' was 435.2 MHz., $V_{in}$ was 3158 m./sec., the angle '$\theta$' was 27.5 degrees, and the spatial periodicity of the grating was 4.26 μm. The value used for the anisotropy parameter '$\gamma$' was $-0.19$ for propagation on ST-cut quartz about the x-propagation direction.

Figure 5:
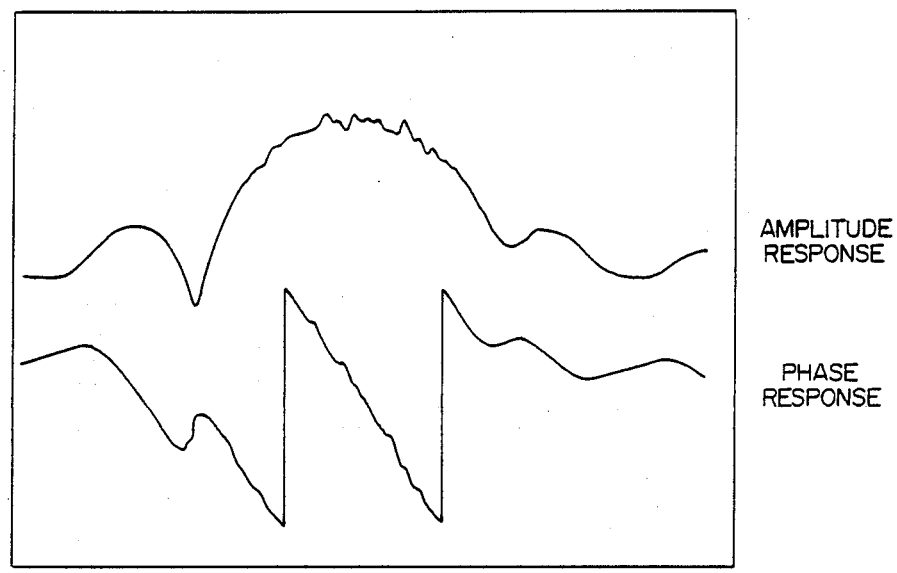
FIG. 5 is an illustration of traces from a network analyzer of the amplitude and phase responses on the delay line when none of the gratings of the invention are present on the piezoelectric solid.
Figure 6:
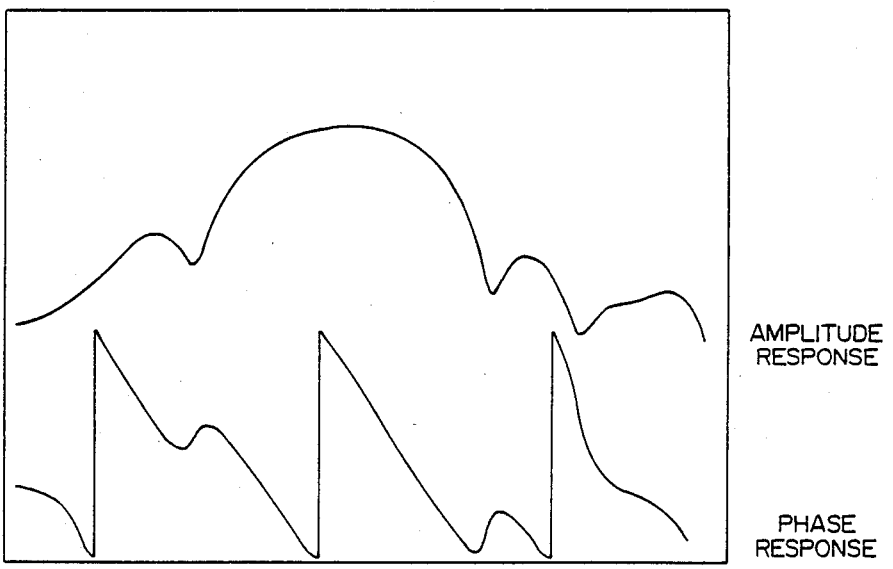
FIG. 6 is an illustration of traces from a network analyzer similar to FIG. 5 but showing the smoother responses obtained on the delay line when gratings are positioned on the solid on each side of the transmission means.

FIGS. 5 and 6 are illustrations of traces from a network analyzer utilizing the quartz SAW filter with the aforementioned values. Calculations indicate that the grating should resonate at approximately 429 MHz. The traces of FIGS. 5 and 6 indicate the SAW response on the delay line without and with, respectively, the gratings 27 and 28 on piezoelectric solid 20. Each of the figures illustrates both the amplitude response and the phase response. The responses of FIG. 6 can be seen to be considerably smoother than those of FIG. 5, indicating a corresponding reduction in the amount of reflected energy detected on the delay line when the grooves are present. The results indicate that the gratings had sufficient bandwidth to operate at the filter frequency of 435.2 MHz.

Although the described embodiment has related to grooves fabricated in piezoelectric solid 20, it is anticipated that similar results would have been obtained by forming a series of parallel ridges on the surface of solid 20 by the deposition of a metal such as aluminum.

We claim:

1. A piezoelectric solid having a surface acoustic wave transmission means comprising a transmitter means and a receiver means positioned on a first one of its surfaces, the direction of wave propagation between the transmitter means and the receiver means being along a first axis, the first axis intersecting a first edge of the solid on one side of the transmission means and also intersecting a second edge of the solid on the other side of the transmission means, the solid having a first grating positioned between the transmission means and the first edge, the first grating being comprised of a series of first grating members extending parallel to each other and crossing the first axis, each of the first grating members being positioned on the solid so as to be approximately longitudinally bisected by the first axis, the longitudinal axis of each first grating member being oriented at an angle relative to the first axis such that a substantial amount of the energy in waves propagating along the first axis toward the first grating is prevented from being reflected back toward, the transmission means, the relationship between the velocity '$V_{in}$' of the acoustic waves along the first axis 'd' the frequency 'f' of those waves, the spatial periodicity 'd' of the first grafting, the solid's anisotropy parameter '$\gamma$' and the angle '$\theta$' between the first axis and a normal to the longitudinal axis of each first grating member is approximated by the following equation:

$$\frac{V_{in}}{f \cdot d} \sim (\cos\theta) + \left(\frac{1}{1-\gamma\theta^2}\right) \cdot \sqrt{1 - ((\sin^2\theta) \cdot (1 - \gamma\theta^2)^2)} \ .$$

2. A piezoelectric solid as in claim 1, wherein the width of each first grating member and the separation distance between adjacent pairs of first grating members is approximately one-half of 'd'.

3. A piezoelectric solid as in claim 1, wherein the depth of each first grating member is approximately one-eighth of the wavelength of the incident acoustic wave.

4. A piezoelectric solid as in claim 1, wherein the solid also has a second grating positioned between the transmission means and the second edge, the second grating being comprised of a series of second grating members extending parallel to each other and crossing the first axis, each of the second grating members being positioned on the solid so as to be approximately longitudinally bisected by the first axis, the angle between the longitudinally axis of each second grating member and the first axis being equal to the angle between the longitudinal axis of each first grating member and the first axis.

5. A piezoelectric solid as in claim 4, therein the width of each of the first and second grating members and the separation distance between adjacent pairs of the first and second grating members is approximately one-half of 'd'.

6. A piezoelectric solid as in claim 4, wherein the depth of each first grating member and each second grating member is approximately one-eighth of the wavelength of the incident acoustic wave.

7. A piezoelectric solid having a first surface on which are positioned a surface acoustic wave transmitter means and a surface acoustic wave receiver means, the transmitter means and receiver means being positioned on a first axis which also extends across a pair of edges of the solid, a first one of the edges being on an opposite side of the transmitter means from the receiver means and the second edge being on an opposite side of the receiver means from the transmitter means, a series of parallel linear first grooves extending across the first axis between the transmitter means and the first edge, a series of parallel linear second grooves extending across the first axis between the receiver means and the second edge, each first groove and each second groove being generally longitudinally bisected by the first axis, the relationship between the velocity '$V_{in}$' of the acoustic waves along the first axis, the frequency 'f' of the acoustic waves, the solid's anisotropy parameter '$\gamma$', the spatial periodically 'd' of the first grooves and the second grooves, and the angle '$\theta$' between the first axis and a normal to the longitudinal axis of each first groove and each second groove being approximately defined by the equation:

$$\frac{V_{in}}{f \cdot d} \sim (\cos\theta) + \left(\frac{1}{1-\gamma\theta^2}\right) \cdot \sqrt{1 - ((\sin^2\theta) \cdot (1 - \gamma\theta^2)^2)} \ .$$

* * * * *